United States Patent [19]
Ohmi

[11] Patent Number: 4,874,494
[45] Date of Patent: Oct. 17, 1989

[54] SEMICONDUCTOR MANUFACTURING APPARATUS

[76] Inventor: Tadahiro Ohmi, 1-17-301, Komegabukuro 2-chome, Sendai-shi, Miyagi-Ken 980, Japan

[21] Appl. No.: 157,507
[22] PCT Filed: Jun. 6, 1987
[86] PCT No.: PCT/JP87/00357
§ 371 Date: Feb. 5, 1988
§ 102(e) Date: Feb. 5, 1988
[87] PCT Pub. No.: WO87/07651
PCT Pub. Date: Dec. 17, 1987

[30] Foreign Application Priority Data
Jun. 6, 1986 [JP] Japan .................. 61-131188

[51] Int. Cl.$^4$ .......................................... C23C 14/36
[52] U.S. Cl. ..................... 204/192.12; 204/192.17; 204/298
[58] Field of Search ............ 204/192.12, 192.32, 204/298, 192.22, 192.23, 298 RS, 192.17

[56] References Cited
U.S. PATENT DOCUMENTS
3,461,054 8/1969 Vratny .................. 204/192.15

FOREIGN PATENT DOCUMENTS
59-18625 1/1984 Japan .
60-2663 1/1985 Japan .

OTHER PUBLICATIONS
J. Vossen, Editor, "Thin Film Processes", Academic Press, N.Y., 1978, pp. 131–134.

*Primary Examiner*—Aaron Weisstuch
*Attorney, Agent, or Firm*—Oblon, Spivak, McClelland, Maier & Neustadt

[57] ABSTRACT

A bias-sputtering apparatus is characterized by having a radio-frequency power source and an exhaust unit and means for impressing a DC bias to at least one of the susceptor and the target electrodes. That is, the invention is a semiconductor manufacturing apparatus for depositing a thin film on the surface of a semiconductor substrate, which is characterized by having a radio-frequency power source and an exhaust unit and means for impressing a desired DC bias to at least the susceptor which holds the semiconductor substrate in the apparatus or the target which is constituted by the thin-film forming material.

5 Claims, 7 Drawing Sheets

SEMICONDUCTOR MANUFACTURING APPARATUS

DESCRIPTION

TECHNICAL FIELD

The present invention relates to a semiconductor manufacturing apparatus, and more particularly to a bias-sputtering apparatus capable of deposition of a high quality thin film at a high speed.

BACKGROUND ART

A sputtering method is widely employed at present to form a thin film of a wiring material for use in an integrated circuit. This is a process of forming a thin film by introducing Ar gas into a vacuum vessel and applying DC or high frequency power to a cathode having a target material mounted thereon to produce glow discharge. As a result of the glow discharge, a target surface is biased to a negative potential with respect to a plasma (called a self-bias), and Ar ions accelerated by the bias voltage impinge on the target surface to sputter and etch the target material. Material particles sputtered from the target are deposited on a wafer placed in opposition to the cathode to form a thin film. Another method, a high frequency bias-sputtering method is known, wherein high frequency power is applied not only to a target but to a susceptor itself on which a wafer is mounted to deposit a film on a wafer surface while permitting sputtering and etching to be effected simultaneously with the aid of the self-bias formed on the wafer surface. Referring here to FIG. 5, illustrating the arrangement of a typical prior bias-sputtering device in a cross section, designated at 501 is for example a target made of Al or SiO$_2$, and 502 is a target electrode having a target mounted thereon. In addition, designated at 503 and 504 are respectively a semiconductor wafer and a susceptor electrode. The target electrode 502 and the susceptor electrode 504 are respectively supplied with high frequency power via a matching circuit, and the vacuum vessel 505 is grounded. For the high frequency power source (RF power source), one having oscillation frequency of 13.56 mHz is typically employed. Moreover, means other than those described above: a vacuum exhaust system, gas introduction inlets, and a mechanism for inserting and removing the wafer are also provided, but they are not shown in the figure for clarity.

The surfaces of the semiconductor wafer 503 and the susceptor 504 are self-biased negatively with respect to the plasma by the RF power applied to the susceptor, on which surfaces Ar ions accelerated by the electric field of the self-biased potential then impinge to sputter part of the deposited film. This method assures a thin film excellent in mechanical strength. This method is furthermore characterized by forming a flat surface film by making use of the fact that the film formed near a stepped portion is likely to be sputtered. This method, however, suffers in practical use from the problem that the etching effected simultaneously with the film deposition causes the speed of film formation to be severely reduced. Furthermore, another significant problem in the manufacture of semiconductor integrated circuits is produced wherein the impingement of Ar ions accelerated by the self-bias on the semiconductor wafer damages the substrate, thereby resulting in deterioration of the constituent elements. These problems are severe obstacles to the practical use of the bias-sputtering apparatus.

The present invention, in view of the drawbacks of the prior semiconductor manufacturing methods, has provided a semiconductor manufacturing apparatus capable of forming a high quality thin film at a sufficiently high speed of film formation without damaging the substrate.

DISCLOSURE OF THE INVENTION

A bias-sputtering apparatus, according to the present invention, is characterized by including a high frequency power source and a DC power source to thereby enable a DC bias to be applied to at least one the susceptor and target electrodes.

Namely, the semiconductor manufacturing apparatus including the high frequency power source and the exhaust unit for depositing a thin film on a semiconductor substrate surface is adapted to permit a desired DC bias to be applied to at least one of the susceptor serving to hold the semiconductor substrate in the apparatus and the target formed by a thin film material.

Figure 1:
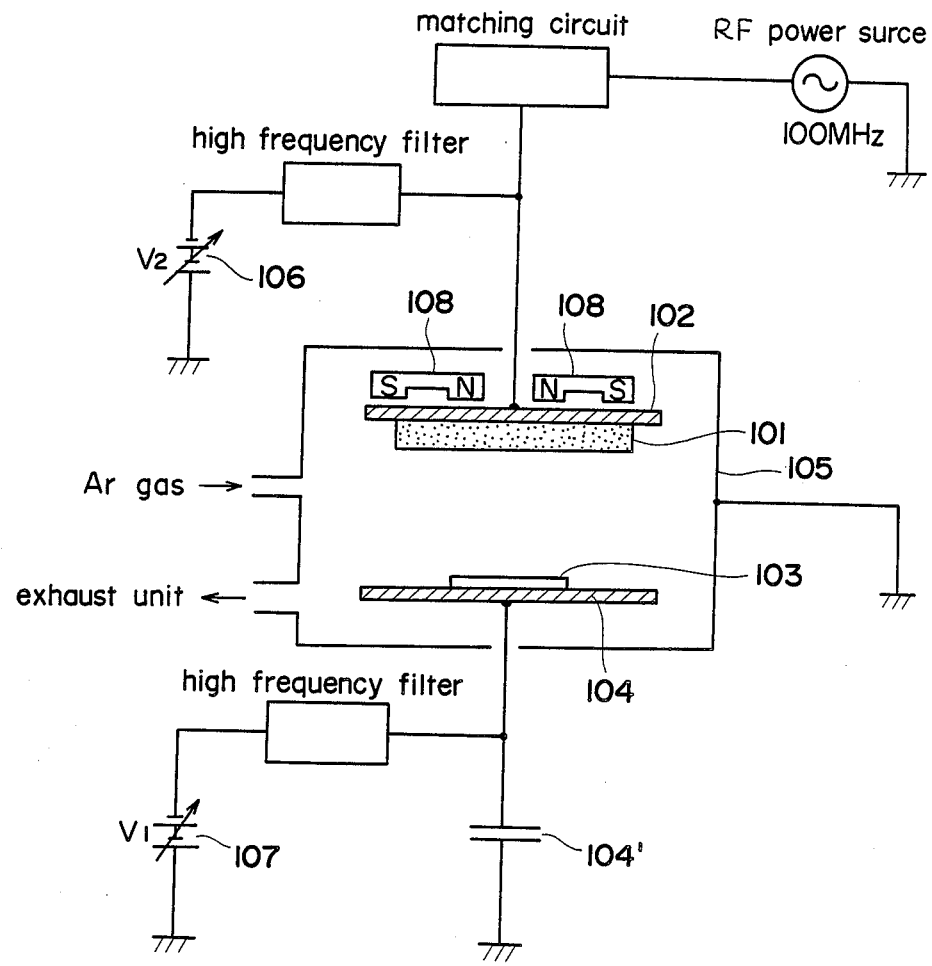
FIG. 1 is a schematic view illustrating a first embodiment of a semiconductor manufacturing apparatus according to the present invention.

Moreover, in the drawings, 101, 401, and 501 are targets; 102, 402, and 502 are target electrodes; 103, 403, and 503 are wafers; 104, 404, and 504 are susceptors; 105, 405, and 505 are vacuum chambers and 106, 107 are DC power sources.

THE PREFERRED EMBODIMENT

In the following, embodiments of the present invention will be described with reference to the accompanying drawings. Here, it is a matter of course that the scope of the present invention is not limited to the embodiments described below.

Figure 5:
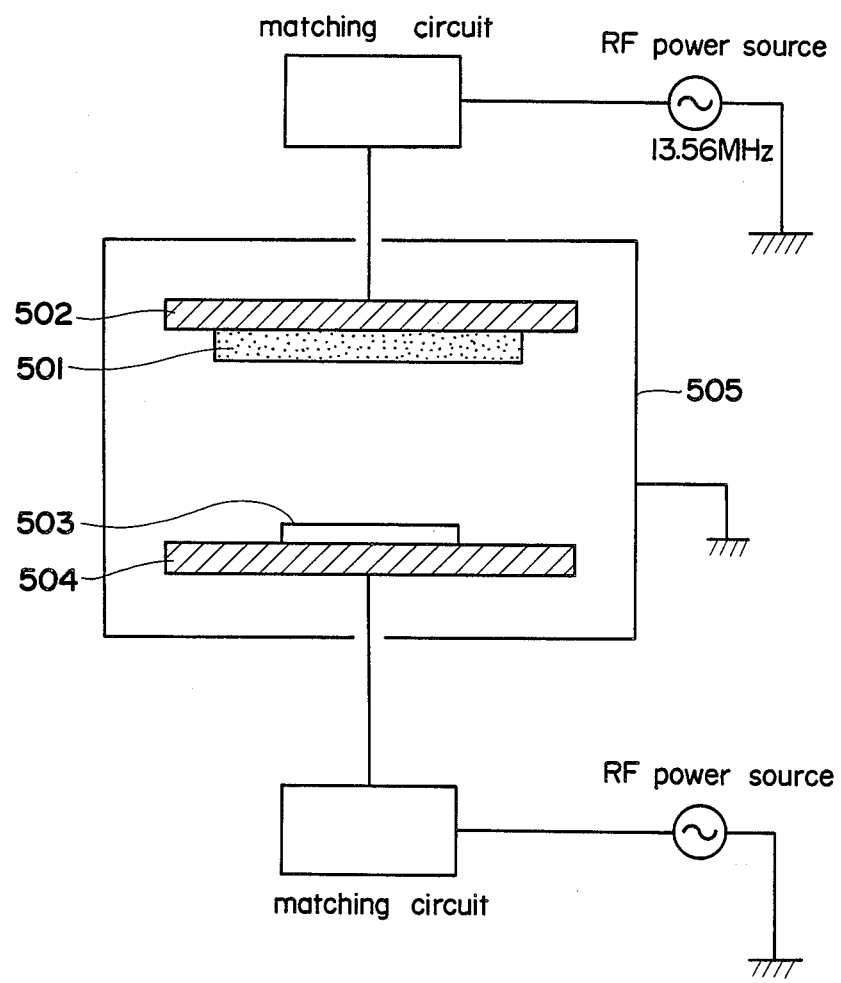
FIG. 5 is a schematic view illustrating a prior art semiconductor manufacturing apparatus.

Referring to FIG. 1 schematically illustrating a first embodiment of a bias-sputtering apparatus, made of a conductive material such as Al and the like, a target 101 of Al, for example, is mounted on a target electrode 102. High frequency power is applied to the target electrode via a matching circuit as in the prior example (FIG. 5), the frequency employed being 100 mHz instead of 13.56 mHz. The target electrode is connected to a DC power source 106 through a filter serving to cut off higher frequencies. Moreover, the silicon wafer 103 and the susceptor 104 are high frequency grounded by means of a capacitor 104' and connected to a DC power source 107 via a high frequency filter. Vacuum chamber 105 is also grounded. Designated at 108 are permanent magnets for magnetron discharge. The apparatus furthermore includes an exhaust unit for evacuating the vacuum vessel, a mechanism for introduction of gas, and a mechanism for taking introducing and removing a wafer, which are not shown here in detail.

First, fundamental requirements for increasing the speed of film formation by high frequency bias-sputtering will be described. Then, processes of how to increase the speed of film formation as well as how to reduce the damage to a semiconductor substrate will be described.

The film formation speed without DC bias to the susceptor electrode, i.e., that by ordinary sputtering is expressed basically as follows:

$$\text{film formation speed} = AI_{ion} \cdot Y_s \cdot f \quad (1).$$

Figure 2A:
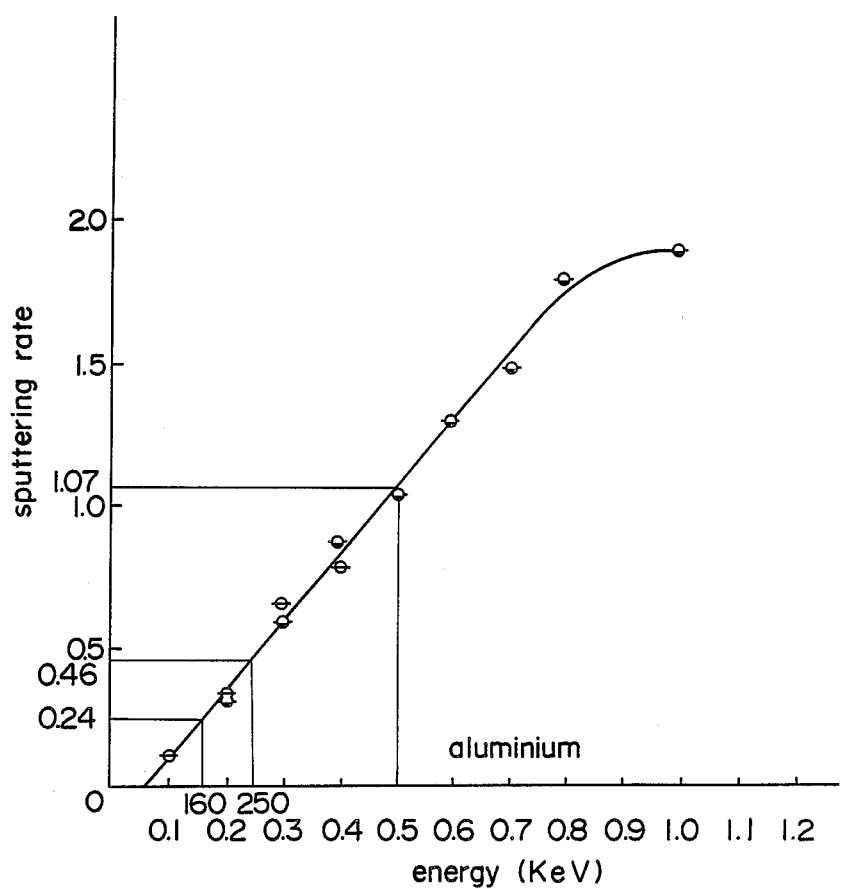
FIGS. 2A–2D are graphs showing potential distributions.

Here, $I_{ion}$ is an ionic current flowing into the target and is proportional to the ion density of the plasma; $Y_s$ is the rate of sputtering for Al by Ar ions and is found to be determined only by the kinetic energy of the incident Ar ions as shown in FIG. 2(a). But, this data is valid only when the Al surface is clean, i.e., only when no insulating film such as $Al_2O_3$, etc. is existent thereon. In addition, the data in the same figure was yielded by rearranging data of Laegreid and Wehner (shown by $\theta$) and that of Weisenfeld (shown by ●) on the same graph. Both are found to well fit to a straight line. f is the probability of sputtered Al atoms impinging the wafer, which is considered to be expressed, as a first approximation, as follows:

$$f = B[1 - C(L/\lambda)] \quad (2)$$

Here, B and C are respectively consetants, $\lambda$ is the mean free path of gas molecules. With $\lambda$ being sufficiently larger than the inter-electrode distance L($\lambda > L$), the second term can be ignored, and hence f·B (constant) holds, thus allowing f to be determined only by the structure of the apparatus. The value $\lambda$ in the equation (2) should in itself take the mean free path of sputtered atoms, but since these sputtered atoms are allowed to collide with and be scattered by gas molecules, the value Z is permitted to take the mean free path of the gas molecules. Against this, with $\lambda$ satisfying the relation: $\lambda \leq L$, the sputtered Al is scattered owing to collision with neutral molecules of Ar, etc., until it reaches the wafer, and hence the probability of the sputtered Al arriving at the wafer is reduced all the more.

Since $\lambda \propto P$ (gas pressure), the equation (2) is finally expressed as:

$$f = B(1 - C'P), \quad C' = \text{constant} \quad (3)$$

and it is thus found f can be increased with P being reduced. Accordingly, in order to increase the film formation speed expressed by the equation (1), each of $I_{ion}$, $Y_s$, and f must be increased. Namely, corresponding to these respective quantities, the following three requirements should be achieved:

I: the plasma must be of high density,
II: the acceleration voltage must be increased to accelerate the Ar ions bombarding the target,
III: the gas pressure must be reduced.

In the following, correctness of our hypothesis based upon equation (1) will be described referring to experimental data. FIG. 2(b) plots coefficients ($\eta$) of the film formation defined as film formation rate/$I_{ion}$ as a function of $V_1$. Since the pressure is constant, a relation:

$$\eta \propto Y_s, \text{ i.e., } \eta \propto |V_1 - V_{th}|$$

is yielded from the equation (1), which is shown in the same figure. Here, $V_{th}$ is a voltage ($\sim 50V$) at which the Al begins to be sputtered by the Ar ions. Although a change in RF power causes plasma density to be varied, the values of $\eta$ are those normalized by the values of $I_{ion}$, and hence the same figure exhibits as a matter of course characteristics independent of the power.

In addition, FIG. 2(c) illustrates how the characteristic of $\eta - V_1$ changes as P is varied. With the pressure decreasing from $8 \times 10^{-3}$ Torr to $5 \times 10^{-3}$ Torr and further to $3 \times 10^{-3}$ Torr, $\eta$ is found to be increased. There is substantially no difference between $3 \times 10^{-3}$ Torr, and $1 \times 10^{-3}$ Torr for $\eta$, which is as expected from the equation (3). The mean free path of Ar at $8 \times 10^{-3}$ Torr is about 1 cm at ordinary temperature, which is smaller than the size of a typical apparatus (3 cm in the present apparatus), and hence the second term of the equation (2) is here not negligible. At $3 \times 10^{-3}$ equal to the mean free path of Ar, and at the degree of vacuum lower than the above value, e.g., at $1 \times 10^{-3}$ Torr, the film formation coefficient $\eta$ is saturated.

On the basis of the abovementioned discussion, the operation of the first embodiment of the bias-sputtering apparatus according to the present invention illustrated in FIG. 1 will now be described.

Figure 2:
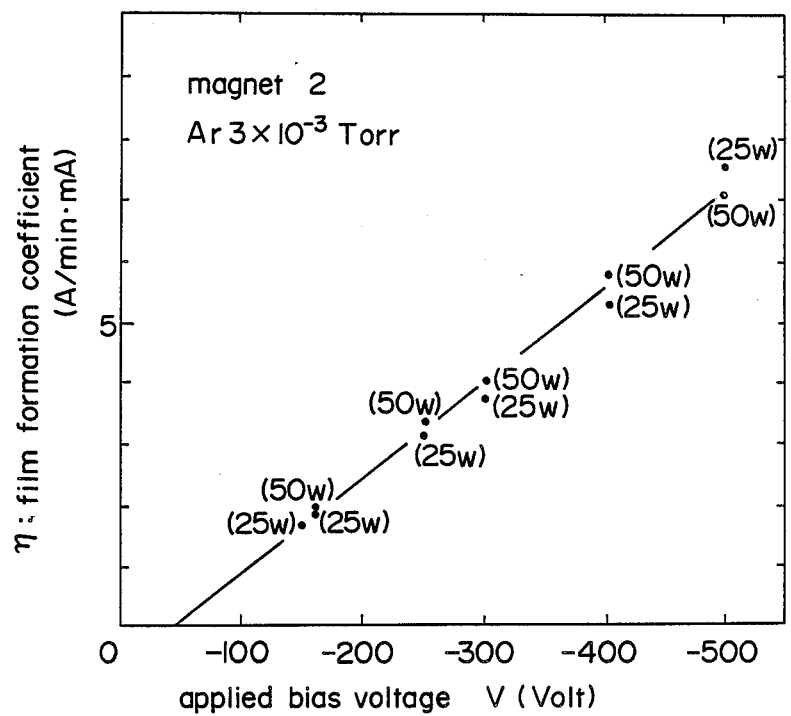
Figure 2:
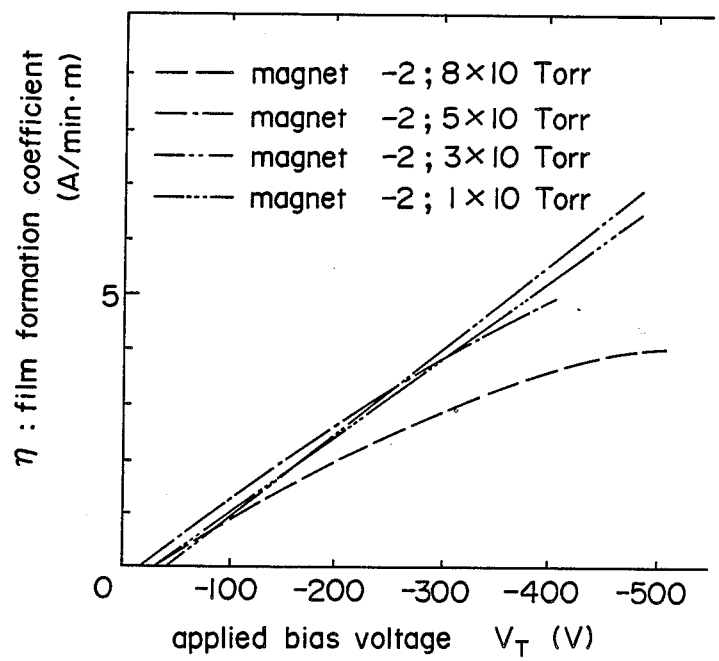
Figure 2:
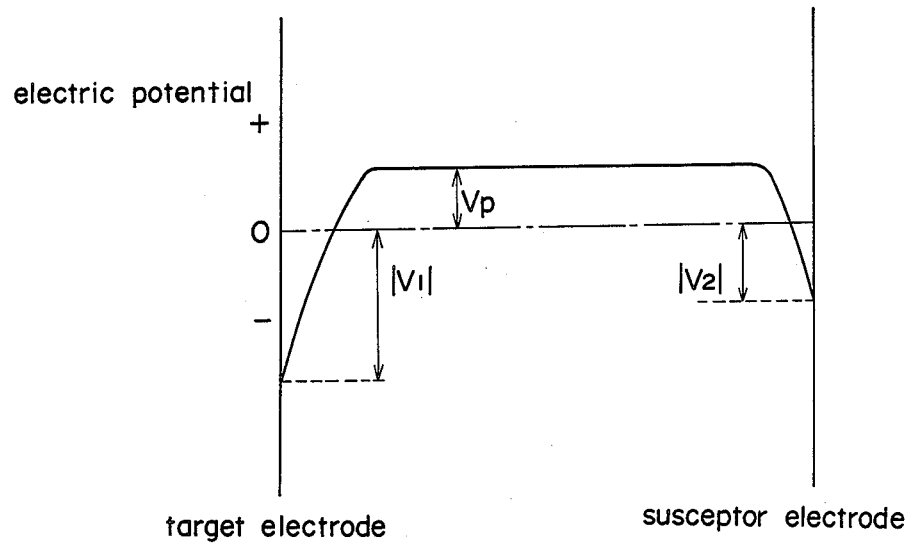

FIG. 2(d) is a schematic view illustrating a potential profile between the target electrode 102 and the susceptor electrode 104 in the discharge state of the apparatus. In the figure, $V_1$ and $V_2$ are respectively output voltages of the DC power sources 107 and 106 in FIG. 1, these voltages being ordinarily assumed to be negative, and $V_p$ is the plasma potential. Conventionally, potential differences such as $V_p + |V_1|$, $V_p + |V_2|$ and the like are called self-biases which are changed in conformity with the geometrical shape of the vessel 105, pressure of Ar gas, high frequency power, and frequency in use, etc., and hence specified by the combination of these parameters. Accordingly, it was impossible to set those parameters arbitrarily, but the present invention enabled those parameters to be arbitrarily determined to desired values since $V_1$ and $V_2$, etc., were supplied from an external power source. Namely, the aforementioned requirement (II) was satisfied by increasing $|V_1|$, and hence it was made possible to raise the rate of sputtering for increasing the speed of film formation. Moreover, in the embodiment of the present invention, to satisfy the aforesaid requirements (I) and (III) simultaneously, a magnet 108 was employed to induce magnetron discharge together with the use of a high frequency of 100 mHz as the high frequency power source, whereby the desired ions were effectively produced even under low pressure to provide a high density plasma. As described above, the bias-sputtering apparatus of the present invention succeeded in increasing the deposition rate of the film by satisfying all the conditions I, II, and III. In the data shown in FIG. 2 (c), $\eta \sim 7 \text{Å}/\text{min.mA}$ for $V_1 = -500$ volt and $p = 3 \times 10^{-3}$ Torr, and $I_{ion} = 110$ mA at that time, whereby the speed of film formation is found to be about 770 Å/min. Ionic current current density flowing into the target is 3.4 mA/cm². This is due to the fact that the target surface is oxidized to form an alumina ($Al_2O_3$) layer thereon during the sputtering owing to residual gas component of $H_2O$ coming from the vacuum vessel and a piping system for supplying gas, whereby the rate of the sputtering $Y_s$ is reduced to about 10%. With respect to such a high vacuum apparatus, the amount of gases flowing into its chamber is extremely little. Accordingly, the vacuum chamber is obliged to have water mixing thereinto from the wall of the piping system at a high rate. The water content of purified Ar was 0.3 ppm, but 0.5% in the chamber. Thereafter, most of the adsorbed gases were removed by sufficiently baking these systems and devising the piping system, whereby the film formation speed was improved to about 2000 to 3000 Å/min. It is furthermor possible to increase the film formation speed by increasing $V_1$, raising the ion density by increasing the high frequency power, or raising ionization rates by increasing magnetic field intensity. As described above, the film formation speed by sputtering according to the present invention is obviously found to be greatly increased as compared with those in prior techniques.

Remarkable reduction of damage to the semiconductor substrate produced upon effecting the bias sputtering will now be described. In the prior techniques, in order to increase $V_p + |V_1|$ for improving the sputtering rate, the procedure is to change the high frequency power and the gas pressure to increase the self-bias value. This method, however, caused the self-bias $V_p + |V_2|$ applied to the substrate to be also increased, and hence an increase, if possible, of the film formation speed resulted in an increase of damage to the substrate. By contrast, because the present invention enables both $V_1$ and $V_2$ to be independently set to arbitrary values it can raise the film formation speed while reducing any damage to the substrate by increasing $V_1$ and holding $V_2$ to a proper value.

Figure 3:
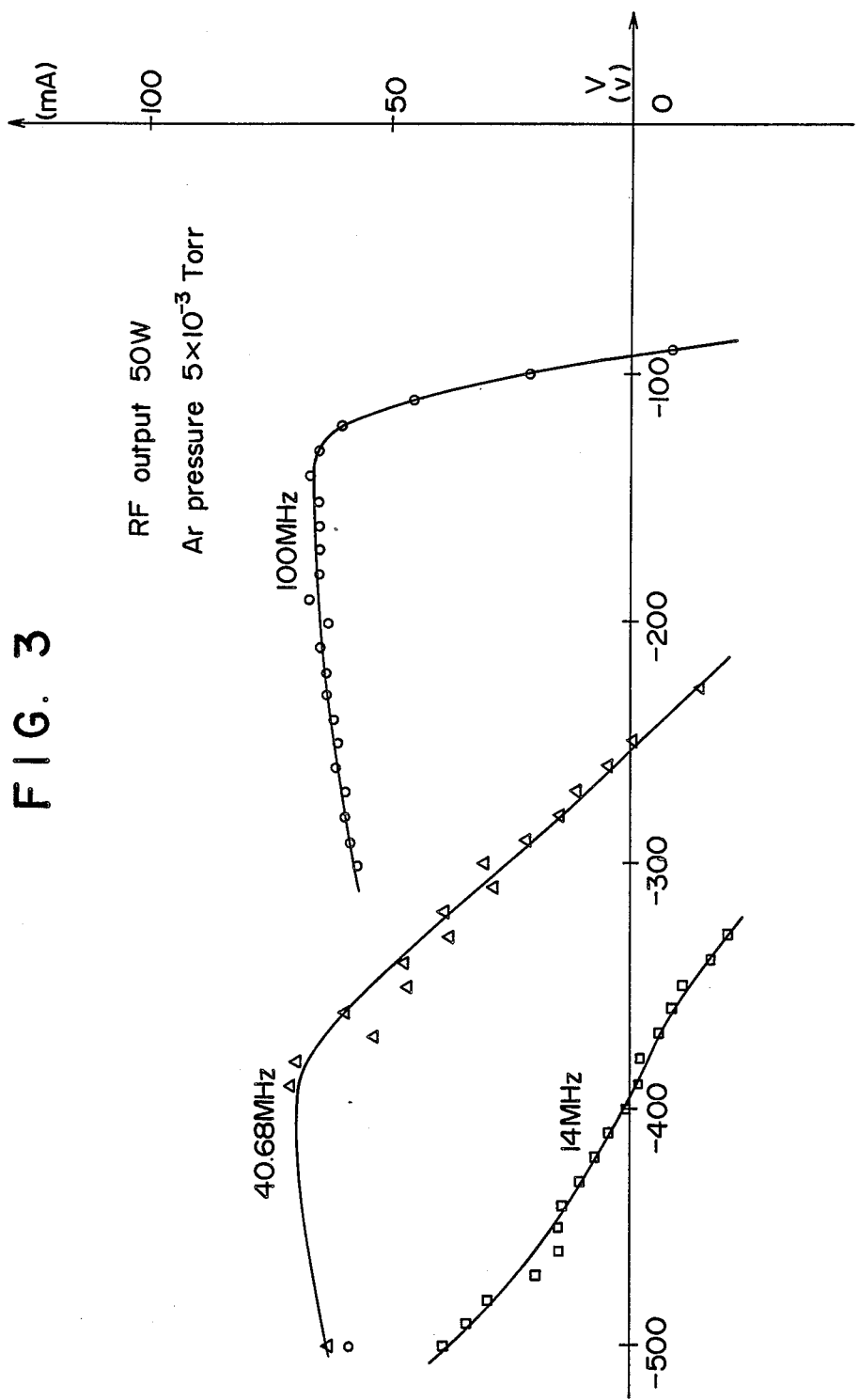
FIG. 3 is a graph showing experimental data concerning current-voltage characteristics of a target.

The present invention has further another feature that the frequency of the high frequency power source is increased from the conventional 13.56 mHz to 100 mHz. Thereby, the width of the kinetic energy distribution of ions in the plasma is reduced to about 1/10 or less as compared with the prior case (13.56 mHz). Data in FIG. 3 exemplarily illustrate such an improvement. The same figure plots current-voltage characteristics of the target electrode with respect to three different frequencies. A bias which produces a zero current is equal to a self-bias, where Ar ions flowing into the target are equal to and balanced with the number of electrons to make the total current zero. An increase of the bias ($V_1$) to the negative side from the self-bias point causes a small positive Ar ionic current to flow but causes a potential barrier against the electrons to be raised whereby those electrons flowing into target are reduced and hence the current is increased. For instance, the characteristic of 100 mHz is constant at a more negative bias than $-120$ V, which is provided only by the ionic current. By contrast, in the characteristic of 40.68 mHz, the current becomes constant, only after raising the barrier beyond $-400$ V. These results show that the energy distribution of the electrons has its more reduced average value and is made more sharp as the frequency of the high frequency power source is increased. Those electrons provide a certain energy distribution thereof as the result of their repetitive elastic and inelastic collisions with Ar in the plasma, and it can be said that this energy distribution reflects in itself a kinetic energy distribution of Ar atoms and Ar ions. Namely, FIG. 3 shows the energy distribution of the ions in the plasma also having its average value and width being more reduced as the frequency of the power source is increased.

This is very important: expressing now the average value of the kinetic energy of the Ar ions as $E_{ion}$ and its deviation from the average value as $\Delta E_{ion}$, the kinetic energy of those Ar ions upon their impingement onto the wafer becomes $E_{ion} + \Delta E_{ion} + q(V_p + V_2)$. Accordingly, if the magnetron discharge is effected at the conventional frequency (13.56 mHz), Ar ions having a large energy deviation $\Delta E_{ion}$ impinge on the target with a certain probability however lowered the potential $V_2$ may be, whereby the wafer surface is given a strong ion impact. In other words, since there are many ions having energies greatly deviated from the average kinetic energy, those ions having higher energies sufficient to damage the wafer impact the wafer however reduced the potential $V_2$ may be. Consequently, reduction only of the potential $V_2$ cannot prevent the wafer from being damaged. By contrast, according to the bias-sputtering apparatus of the present invention, the width of the distribution of the kinetic energy of $E_{ion}$ of the Ar ions incident upon the substrate is reduced to about 1/10 as compared with the prior case, and hence Ar ions can reach the wafer surface substantially at the same kinetic energy without variation in the energy. Namely, with the adjustment of the potential $V_2$, almost all the Ar ions can be bombarded onto the wafer surface with desired kinetic energy. Thus, according to the present invention, the bias-sputtering can be executed substantially with no damage to the silicon substrate. As a result, problems in the prior art of a threshold of a MOS transistor being shifted or of unstable characteristics of semiconductor devices being caused by allowing the density of electrons trapped in a gate oxide film to be increased and hot electrons to be injected can be solved. In such a manner, reliability of LSIs can be sharply improved.

It should be noted here that the prior methods cannot not assure the same effect even if the RF frequency is made higher. The reason is, as evidenced from FIG. 3, that with the RF frequency being increased, the self-bias ($V_T$ when $I_T=0$) is reduced, thus causing the sputtering rate to be lowered. Only such independent control of the potential $V_1$ as in the present invention can assure the increase of the film formation speed and the reduction of the damage, simultaneously.

Summarizing the fundamentals of the present invention, with a plasma being produced effectively to the utmost under the condition of low pressure, ions in the plasma are accelerated under a sufficiently high electric field provided from the outside to effectively sputter the target while Ar ions reaching the semiconductor substrate are, after being sufficiently narrowed in their energy distribution, accurately controlled in their energy by external DC voltage and supplied to the semiconductor wafer surface, whereby any damage to the substrate is not only reduced but a high quality film can be formed.

In addition, the present invention assures a single crystal Al thin film formed on the silicon substance. Namely, the present invention is adapted to deposit Al atoms only at correct crystal sites by noting the difference between bond energies of Al atoms reaching correct crystal sites and incorrect sites, and adjusting the potential $V_2$ so as to resputter only the latter Al atoms located at the incorrect sites. Al atoms at normal crystal sites are not sputtered unless Ar ions more than about 50 eV are bombarded thereonto. Nevertheless, Al atoms randomly adsorbed on the wafer surface are sputtered by impingement of Ar ions having lower energies than those Al atoms. An Al film thus formed has excellent characteristics as a wiring material: the life of the wiring due to electromigration is sharply increased, and no spike phenomenon at an interface with Si is produced even under annealing at 500° C.

Although an embodiment of the present invention has been disclosed as described above, the invention is not limited to the arrangement of FIG. 1. For example, either one of the DC power sources 106 and 107 may be omitted. Namely, provided a sufficient sputtering rate is yielded with a self-bias, the power source 106 may be omitted. Moreover, provided that damage to the substrate may be allowed, the power source 107 may be omitted.

Figure 4:
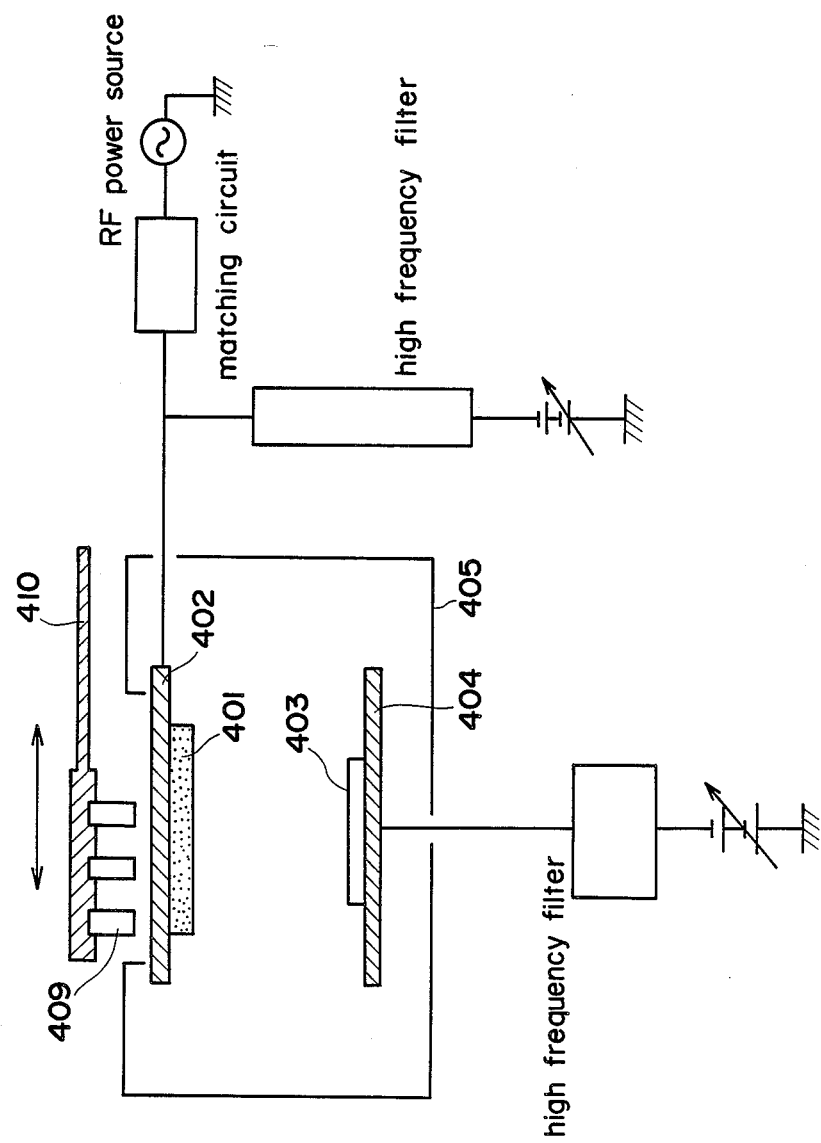
FIG. 4 is a schematic view illustrating a second embodiment of the present invention.

In addition, the magnet 108 located on the back of the target electrode 102 is not limited to the arrangement of FIG. 1. For example, a strong track type magnet 409 may be so installed that it can be scanned to improve homogeneity, as illustrated in a second embodiment of the present invention in FIG. 4. Installation of a scanning system 410 placed outside a vacuum vessel 405 as shown in FIG. 4, for example, permits a reaction system to be advantageously prevented from being contaminated due to dust produced by any mechanical operation. Furthermore, the magnet 108 may be omitted if unnecessary without departing from the scope of the present invention.

In addition, the RF frequency of 100 mHz described here is only an example and is not limited to that value. But, from the viewpoint of controlling distribution as described above, a high frequency more than 100 mHz may, of course, be employed.

Moreover, the following method may be employed, for example, for further reduction of the damage to the substrate. Namely, when depositing a metal film such as of Al on a silicon surface via a contact hole, the bias on the silicon substrate is made zero without resputtering during the initial thickness formation of the film ranging from about several tens to hundreds of Å, and thereafter the bias-sputtering is executed. With such an arrangement, no resputtering is conducted when the silicon surface is exposed to the outside and sputtering is started after a thin film is formed on the surface, and hence any damage to the substrate silicon can substantially be eliminated.

Although in the above description only Al was exemplarily employed as the target, any other material such, for example, as alloys of Al-Si, Al-Si-Cu and the like, silicides of $MoSi$, $WSi_2$, $TaSi_2$, $TiSi_2$ and the like. W and Mo metals, and insulating films such as $SiO_2$, $Al_2O_3$ and $Si_3N_4$, etc., may be employed for deposition, as a matter of course.

EFFECT OF THE INVENTION

According to the present invention, as described above, it is made possible to form with ease a high quality film at a higher deposition speed without causing any damage to the substrate.

I claim:

1. A bias-sputtering apparatus for depositing a thin film on a substrate surface, comprising:
   a vacuum chamber connected to an exhaust unit;
   a sputtering target electrode to hold a target;
   a power source of a high frequency greater than 100 MHz connected to said target;
   means for applying a desired DC bias potential to at least one of a susceptor adapted to hold said substrate in the apparatus and said sputtering target electrode; and
   means for generating a magnetic field around said target.

2. A semiconductor manufacturing apparatus according to claim 1 wherein said apparatus further comprises:
   means to independently supply a desired DC bias to both of said susceptor and said target.

3. A method for depositing a thin film on a substrate surface by bias-sputtering, comprising the steps of:
   mounting a target on a target electrode in a vacuum vessel;
   applying a power source of high frequency greater than 100 MHz to said target and further applying a desired DC bias potential to at least one of a susceptor serving to hold said substrate and said target.

4. A method for depositing a thin film on a substrate surface by bias-sputtering according to claim 3, which further comprises:
   adjusting the DC bias potential so as to resputter only deposited atoms located at incorrect sites.

5. A method for depositing a thin film on a substrate surface by bias-sputtering according to claim 3, which further comprises:
   adjusting the bias potential applied to the susceptor to a zero value during the formation of its initial thickness ranging from about several tens to hundreds of Å, and thereafter applying said desired DC bias potential to the susceptor to form said thin film.

* * * * *